(12) United States Patent  
McGrath

(10) Patent No.: US 6,515,603 B1
(45) Date of Patent: Feb. 4, 2003

(54) SIGMA DELTA MODULATOR WITH BURIED DATA

(75) Inventor: David Stanley McGrath, Bondi (AU)

(73) Assignee: Lake Technology Limited., Ultimo (AU)

( * ) Notice: Subject to any disclaimer, the term of this patent is extended or adjusted under 35 U.S.C. 154(b) by 0 days.

(21) Appl. No.: 09/605,267

(22) Filed: Jun. 26, 2000

(51) Int. Cl.$^7$ ................................................ H03M 3/00
(52) U.S. Cl. .................. 341/143; 341/131; 341/67; 341/155; 341/172
(58) Field of Search .................. 341/143, 131, 341/67

(56) References Cited

U.S. PATENT DOCUMENTS

| | | | | |
|---|---|---|---|---|
| 5,027,120 A | * | 6/1991 | Thurston | 341/143 |
| 5,073,777 A | * | 12/1991 | Fukuhara et al. | 341/143 |
| 5,189,418 A | * | 2/1993 | Bartz et al. | 341/155 |
| 5,196,852 A | * | 3/1993 | Galton | 341/143 |
| 5,200,750 A | * | 4/1993 | Fushiki et al. | 341/143 |
| 5,208,594 A | * | 5/1993 | Yamazaki | 341/143 |
| 5,424,739 A | * | 6/1995 | Norsworthy et al. | 341/143 |
| 5,451,947 A | * | 9/1995 | Morrison | 341/131 |
| 5,471,209 A | * | 11/1995 | Sutterlin et al. | 341/143 |
| 5,745,061 A | * | 4/1998 | Norsworthy et al. | 341/143 |

* cited by examiner

Primary Examiner—Michael Tokar
Assistant Examiner—Lam T. Mai
(74) Attorney, Agent, or Firm—Knobbe, Martens, Olson & Bear, LLP

(57) ABSTRACT

A sigma delta modulator is disclosed and claimed. In one embodiment, the sigma delta modulator may comprise input means for inputting an input signal stream; summing means interconnect to the input means for adding a feedback signal stream to the input signal to produce an altered input signal stream; low pass filtering means interconnected to the summing means for low pass filtering the altered input signal stream to produce a low pass filtered signal stream; bit stuffing means for adding predetermined values in predetermined positions in the low pass filtered signal stream to form a bit stuffed low pass filtered stream; and a quantizer for quantizing the bit stuff low pass filtered signal to produce an output signal stream, the output signal stream also being fed back to the summing means so as to form the feedback signal stream.

9 Claims, 4 Drawing Sheets

SIGMA DELTA MODULATOR WITH BURIED DATA

FIELD OF THE INVENTION

The present invention relates to the field of sigma delta modulation, and, in particular discloses methods for embedding data in a sigma delta modulated stream.

BACKGROUND OF THE INVENTION

Sigma delta modulators are becoming increasingly important in the digital signal processing (DSP) field and are useful in analog-to-digital (A/D) conversion, one bit processing etc.

For a full discussion of the operation of sigma delta modulators, reference is made to one of the standard texts in the field. For example, "Delta-Sigma Data Converters—Theory, Design and Simulation", S. Norsworthy et. al., published 1997 by IEEE Press Marketing.

Recently, companies such as Sony Inc. of Japan have announced standard audio formats such as the Super Audio™ format which stores data in a sigma delta modulated form and hence it is likely that increased utilization of sigma delta modulation will arise, particularly in the audio field.

By way of example, in FIG. 1 there is illustrated a standard form of sigma delta modulator 1 which transforms an input signal 2 to an output signal 6. The input signal 2 is first added 3 to a feedback and the output is low pass filtered 4. A quantizer 5 then maps the output of filter 4 to a +1 or −1 value which is output as a 1 bit stream 6. The output 6 is also feedback via delay loop 7 to the input 2.

SUMMARY OF THE INVENTION

In certain embodiments, the present invention provides for the storage of data streams within sigma delta modulated streams.

In accordance with a first aspect of the present invention, there is provided a method of forming a modified sigma delta modulated data stream by computing each output sample comprising: (a) calculating an output sample by a process of sigma delta modulation; (b) altering predetermined ones of a first series values to values corresponding to a data stream located within the sigma delta modulation so as to form said modified sigma delta modulator data stream; and (c) including samples of said modified sigma delta modulated data stream in the feedback path of the sigma delta modulation.

The method can further comprise (d) modifying the magnitude of other predetermined members of said first series in a manner as determined by the values of corresponding data stream values.

In accordance with a further aspect of the present invention, there is provided a sigma delta modulator, comprising: input means for inputting an input signal stream; summing means connected to said input means for adding a feedback signal stream to said input signal to produce an altered input signal stream; low pass filtering means connected to said summing means for low pass filtering said altered input signal stream to produce a low pass filtered signal stream; a quantizer for quantizing said low pass filtered signal to produce a first output signal stream; and bit stuffing means for inserting predetermined values in predetermined positions in said first output signal stream to form a final output signal stream, said final output signal stream also being fed back to said summing means so as to form said feedback signal stream.

In accordance with a further aspect of the present invention, there is provided a sigma delta modulator, comprising: input means for inputting an input signal stream; summing means connected to said input means for adding a feedback signal stream to said input signal to produce an altered input signal stream; low pass filtering means connected to said summing means for low pass filtering said altered input signal stream to produce a low pass filtered signal stream; bit stuffing means for adding predetermined values in predetermined positions in said low pass filtered signal stream to form a bit stuffed low pass filtered stream; and a quantizer for quantizing said bit stuffed low pass filtered stream to produce an output signal stream, said output signal stream also being fed back to said summing means so as to form said feedback signal stream. The predetermined values can comprise a convolution of a zero padded data input stream with at least one negative number and a unity value.

In accordance with a further aspect of the present invention, there is provided a sigma delta modulator, comprising: a summer receiving an input signal stream and a feedback signal stream, and producing an altered input signal stream; a low pass filter connected to the summer, and producing a low pass filtered signal stream; a quantizer connected to the low pass filter and producing a first output signal stream; and a bit stuffer configured to insert predetermined values in predetermined positions in said first output signal stream, and producing a final output stream, said final output stream also being fed back to the summer as the feedback signal stream.

BRIEF DESCRIPTION OF THE DRAWINGS

Notwithstanding any other forms which may fall within the scope of the present invention, preferred forms of the invention will now be described, by way of example only, with reference to the accompanying drawings in which.

DETAILED DESCRIPTION OF CERTAIN EMBODIMENTS OF THE INVENTION

Figure 2:
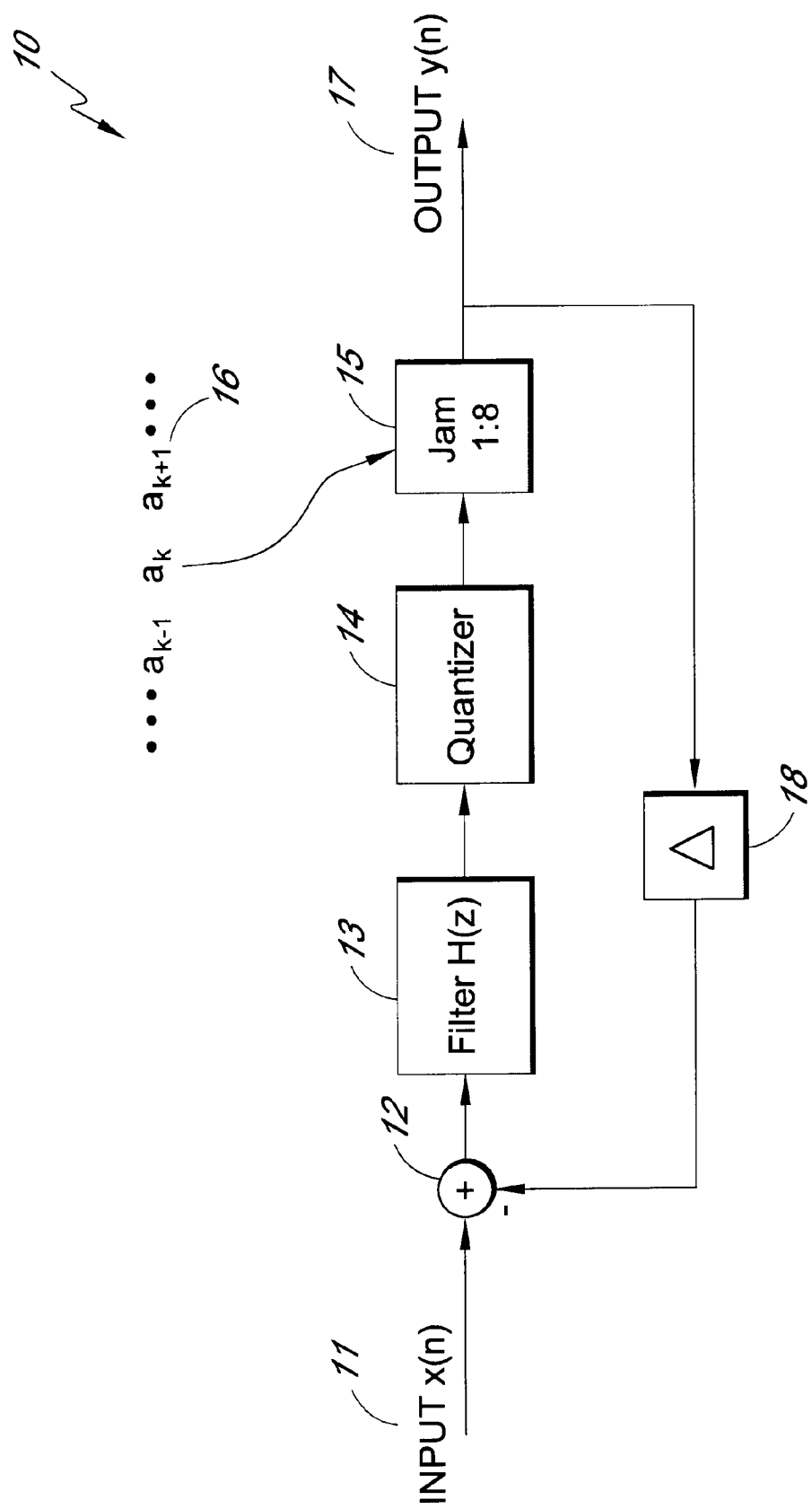
FIG. 2 is a schematic illustration of a first modified form of sigma delta modulator.

In one preferred embodiment, a 1 bit stream is 'stuffed' into the sigma delta modulated stream in a manner such that the overall performance degradation is minimal. The utilization of bit stuffing provides the ability to encode control and data streams within a 1-bit encoded stream whilst allowing for minimal degradation. Assuming it is desired to insert a bit stream A:

$$A=\{\ldots a_{k-2}, a_{k-1}, a_k, a_{k-1}\ldots\}$$

in a sigma delta modulated stream, then a first simplified embodiment can be as illustrated in FIG. 2. This embodiment 'stuffs' the relevant A stream value in every 8th bit of the output stream. In this simplified embodiment, the sigma delta modulator 10 is provided with units 11–14, 17,18 which act as before. However, a bit stuffer 15 is provided which jams the data value $a_k$ at every 8th bit of the output stream.

It has been found in practice that the arrangement 10 often produces adequate results as the sigma delta modulator attempts to 'correct' for the stuffed bit.

In a further modified embodiment, attempts are made to influence the sigma delta modulator output to better account for the bit stuffing process.

Firstly, the data is prepared in that the stream of A data values is first zero padded as follows:

$$A_{zp}=\{0, 0, a_{k-1}, 0, 0, 0, 0, 0, 0, 0, a_k, 0, 0, 0, 0, 0, 0, 0, a_{k+1}\ldots\}$$

This stream is then convolved to produce $A_{jam}$ as follows:

$$A_{jam}=A_{zp}\otimes\{-0.2,\}$$

which produces:

$$A_{jam}=\{\ldots 0,-0.2a_{k-1},a_{k-1}, 0,0,0,0,0,0,-0.2a_k,a_k,0,0\}$$

Figure 1:
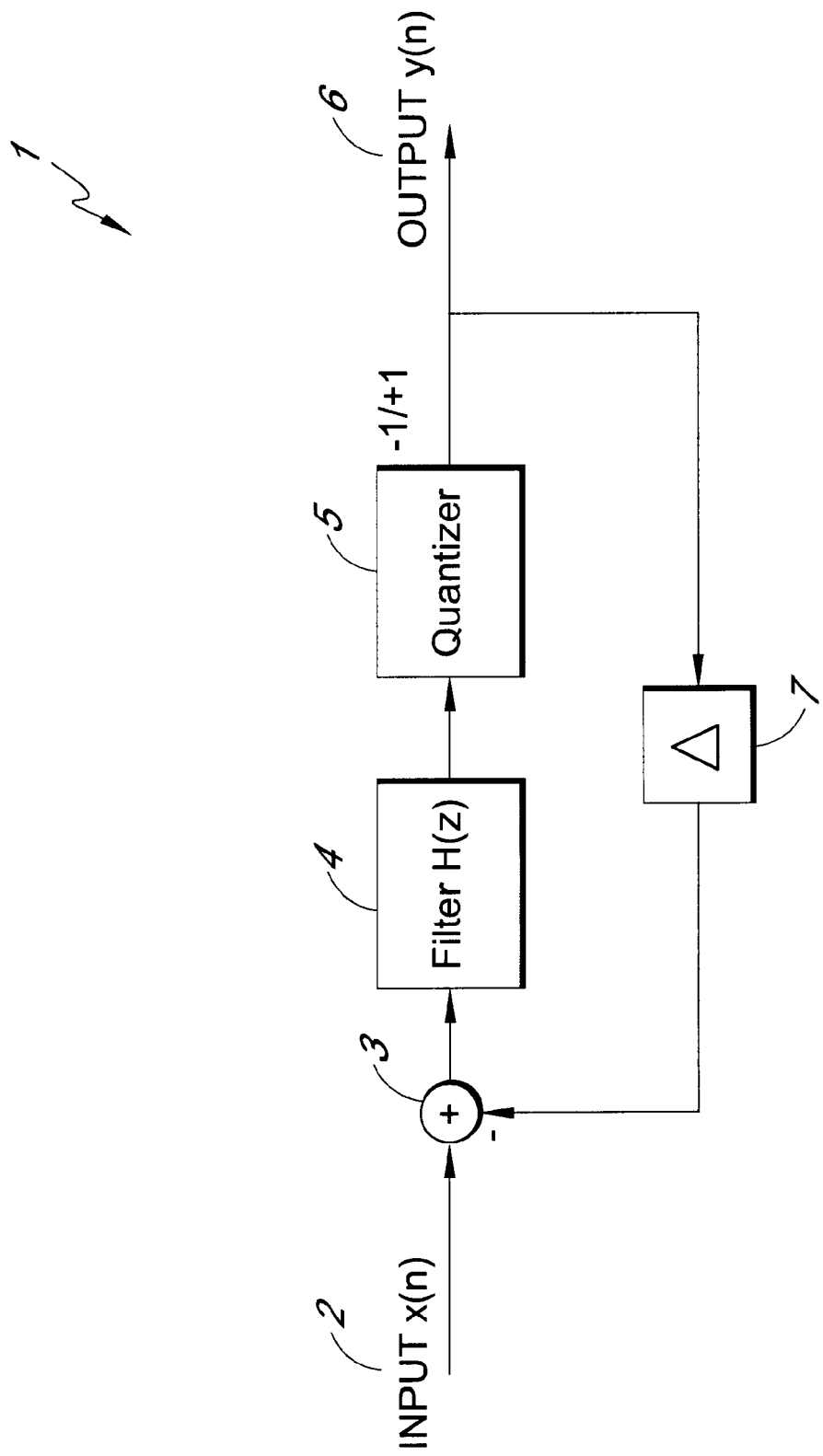
FIG. 1 is a schematic illustration of a sigma delta modulator.
Figure 3:
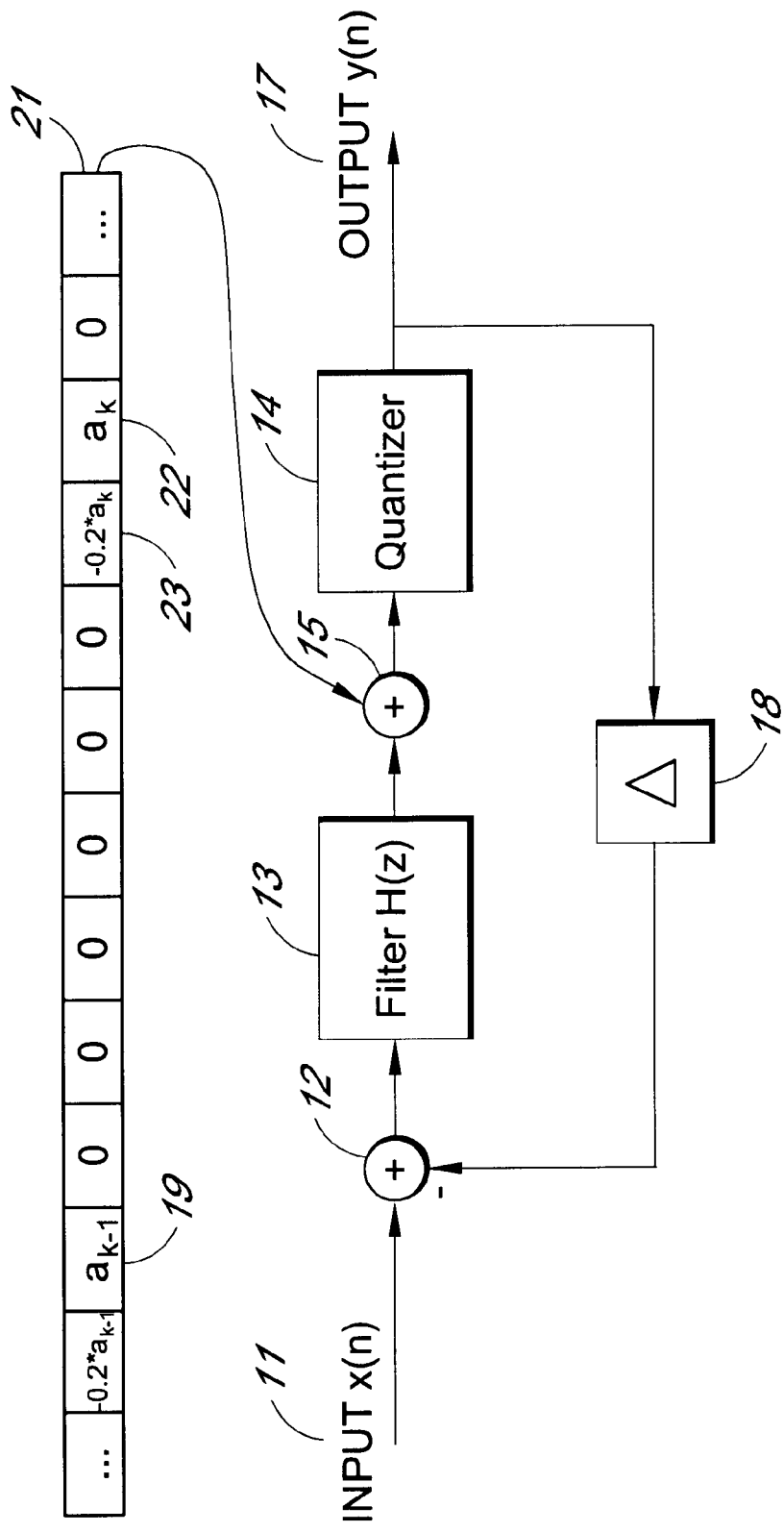
FIG. 3 is a schematic illustration of a second modified form of sigma delta modulator.
Figure 4:
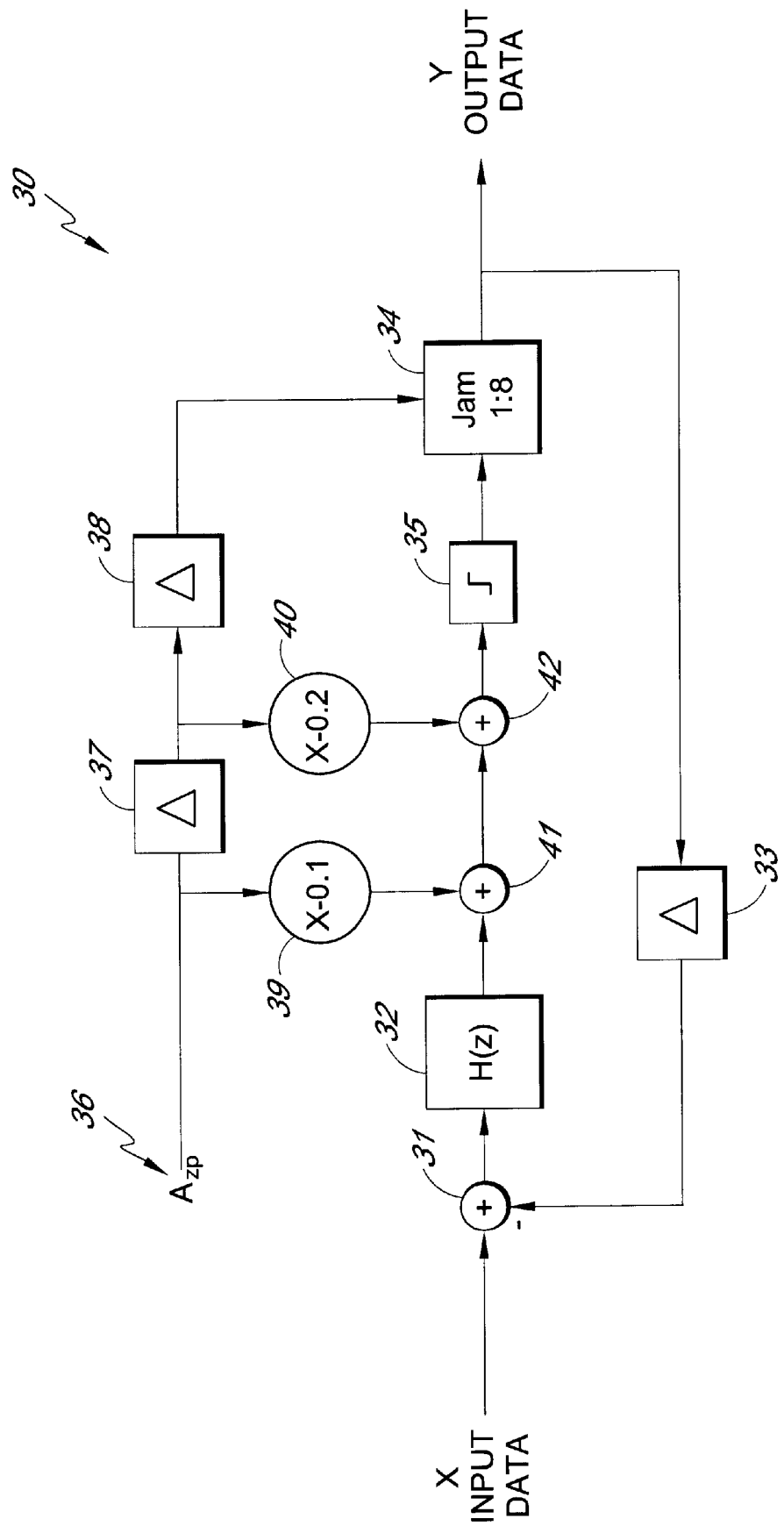
FIG. 4 is a schematic illustration of a third modified form of sigma delta modulator.

This stream is then jammed in a slightly modified manner to that shown in FIG. 1 as shown in FIG. 3. The stream 21 can be added 15 to the output of filter 13 with the result being fed to quantizer 14 with the remaining components operating in the normal manner. The feeding of a negative amount of $a_k$ to the preceding data value helps it anticipate the presence of $a_k$ and reduced noise levels result. The arrangement of FIG. 3 can be extended. For example, say that $A_{jam}$ is produced as follows:

$$A_{jam}=A_{zp}\otimes\{-0.1, -0.2, 1\}$$

then this can be implemented by the arrangement 30 as illustrated in FIG. 4. In this case, the elements 31–35 all operate in the manner previously described. The input stream 36 goes through a series of delays e.g. 37 and 38 and multipliers 39 and 40 which implement the convolution. The two adders 41, 42 add the results to the filter output 32 with the result being quantized 35.

It would be appreciated that some embodiments can be implemented by suitable programming of a digital signal processor or computer system arrangement or can be implemented directly in hardware.

It would be further appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

What is claimed is:

1. A method of forming a modified sigma delta modulated data stream by computing each output sample, comprising:
   calculating an output sample by a process of sigma delta modulation so as to form a current first series of values;
   altering predetermined ones of said current first series of values to values corresponding to a data stream introduced into said current first series of values so as to form said modified sigma delta modulated data stream; and
   utilizing said altered predetermined ones of said current first senes of values in the feedback path.

2. The method of claim 1 further comprising modifying the magnitude of other predetermined members of said current first series of values in a manner as determined by the values of the corresponding introduced data stream values.

3. A sigma delta modulator, comprising:
   an inputter for inputting an input signal stream;
   a summer coupled to said inputter for adding a feedback signal stream to said input signal to produce an altered input signal stream;
   a low pass filter coupled to said summer for low pass filtering said altered input signal stream to produce a low pass filtered signal stream;
   a quantizer coupled to said low pass filter for quantizing said low pass filtered signal stream to produce a first output signal stream; and
   a bit stuffer for inserting predetermined data values in predetermined positions in said first output signal stream to form a final output sign stream, said final output signal stream also being fed back to said summer so as to form said feedback signal stream.

4. A sigma delta modulator comprising:
   an inputter for inputting an input signal stream;
   a summer coupled to said inputter for adding a feedback signal stream to said input signal to produce an altered input signal stream;
   a low pass filter coupled to said summer for low pass filtering said altered input signal stream to produce a low pass filtered signal stream;
   a bit stuffer coupled to said low pass filter for adding predetermined data values in predetermined positions in said low pass filtered signal stream to form a bit stuffed low pass filtered stream; and
   a quantizer for quantizing said bit stuffed low pass filtered stream to produce an output signal stream, said output signal stream also being fed back to said summer so as to form said feedback signal steam.

5. A sigma delta modulator as claimed in claim 4, wherein said predetermined data values comprise a convolution of a zero padded data input stream with at least one negative number and a unity value.

6. A sigma delta modulator as claimed in claim 5 in which the negative number has a below unity value and is located before the unity value in the bit stream.

7. A sigma delta modulator, comprising:
   a summer for receiving an input signal stream and a feedback signal stream, and for producing an altered input signal stream;
   a low pass filter coupled to the summer for producing a low pass filtered signal stream;
   a quantizer couple to the low pass filter for producing a first output signal stream; and
   a bit stuffer configured to insert predetermined values in predetermined positions in said first output signal stream, and producing a final output stream said final output stream also being fed back to the summer as the feedback signal stream.

8. A sigma delta modulator as claimed in claim 7 wherein said predetermined values comprise a zero padded data input stream with at least one negative number and a unity value.

9. A sigma delta modulator comprising:

input means for imputing an input signal stream;

summing means connected to said input means for adding a feedback signal stream to said input signal to produce an altered input signal stream;

low pass filtering means connected to said summing means for low pass filtering said altered input signal stream to produce a low pass filtered signal stream;

bit stuffing means for adding predetermined values in predetermined positions in said low pass filtered signal stream to form a bit stuffed low pass filtered stream, wherein said predetermined values comprise a convolution of a zero padded data input with at least one negative number and a unity value; and a quantizer for quantizing said bit stuffed low pass filtered stream to produce an output signal stream, said output signal stream also being fed back to said summing means so as to form said feedback signal stream.

* * * * *